US008872569B2

(12) United States Patent
Garrison et al.

(10) Patent No.: US 8,872,569 B2
(45) Date of Patent: Oct. 28, 2014

(54) AUTOMATIC QUADRATURE NETWORK WITH PHASE AND AMPLITUDE DETECTION

(71) Applicants: Kelly F. Garrison, Tigard, OR (US);
Raymond L. Veith, Portland, OR (US);
Gordon A. Olsen, Tigard, OR (US);
Jeffrey D. Earls, Portland, OR (US)

(72) Inventors: Kelly F. Garrison, Tigard, OR (US);
Raymond L. Veith, Portland, OR (US);
Gordon A. Olsen, Tigard, OR (US);
Jeffrey D. Earls, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 50 days.

(21) Appl. No.: 13/681,278

(22) Filed: Nov. 19, 2012

(65) Prior Publication Data

US 2014/0139279 A1    May 22, 2014

(51) Int. Cl.
*H03H 11/16*    (2006.01)
*H03H 11/20*    (2006.01)
*H03H 11/22*    (2006.01)

(52) U.S. Cl.
CPC ............... *H03H 11/20* (2013.01); *H03H 11/22* (2013.01)
USPC ............................ 327/328; 327/254; 327/255

(58) Field of Classification Search
USPC .......................................... 327/238, 254, 255
See application file for complete search history.

(56) References Cited

U.S. PATENT DOCUMENTS

| 5,644,260 | A | 7/1997 | Dasilva et al. |
| 6,313,680 | B1 | 11/2001 | Havens et al. |
| 6,982,584 | B2 * | 1/2006 | Melly .......................... 327/254 |
| 8,269,543 | B2 * | 9/2012 | Teetzel ........................ 327/254 |

FOREIGN PATENT DOCUMENTS

WO    0143295 A2    6/2001

OTHER PUBLICATIONS

European Search Report and Written Opinion for Application No. 13193411.9 dated Feb. 21, 2014, 6 pages.

* cited by examiner

*Primary Examiner* — Hai L Nguyen
(74) *Attorney, Agent, or Firm* — Francis I. Gray; Marger, Johnson & McCollom, P.C.

(57) ABSTRACT

An automatic quadrature network with amplitude and phase detection produces quadrature signals for an input oscillator signal, the quadrature signals being equal in amplitude and having ideal quadrature phase between them. An RC circuit provides one quadrature path, and a CR circuit provides another quadrature path. The outputs from the RC/CR circuits are amplitude detected to produce an amplitude control signal. The outputs also are amplitude limited, and the phase between the limiter outputs is detected to produce a phase control signal. The amplitude and phase control signals are combined to generate respective control signals for the RC/CR circuits to automatically align them so that the quadrature signals are of equal amplitude and ideal quadrature phase.

12 Claims, 3 Drawing Sheets

AUTOMATIC QUADRATURE NETWORK WITH PHASE AND AMPLITUDE DETECTION

BACKGROUND OF THE INVENTION

The present invention relates to quadrature frequency converters, and more particularly to an automatic quadrature network with phase and amplitude detection to eliminate both phase and amplitude errors in a frequency converter output.

Quadrature (I/Q) frequency converters rely on having a pair of mixers which are driven by a quadrature local oscillator signal, i.e., two signals of the same frequency, but ninety degrees out of phase. One of the simpler methods of achieving the desired result is to input a single frequency to a quadrature network having two phase shifting paths, one path with a series resistor followed by a shunt capacitance (RC), and the other path with a series capacitance followed by a shunt resistance (CR). If the resistances are equal and the capacitances are equal, then there is a particular frequency for the single frequency input where the outputs of the two paths are of equal amplitude and in quadrature phase. Outside of the particular frequency, while the phase relationship is held, the amplitudes may vary.

One method of generating quadrature signals from a local oscillator (LO) uses amplitude detectors and a feedback control loop which adjusts either resistance or capacitance values in the RC and CR paths until the quadrature signals are matched in amplitude. This method is illustrated by U.S. Pat. No. 5,644,260 (DaSilva) and G.B. Patent No. 1,345,274 (Ratzel). However, this method cannot generate perfect phase quadrature and equal amplitudes when the non-varied elements of the network don't match, when the variable elements don't track exactly, or when parasitic elements exist. For example, because of some non-ideal components—an R is too big or too small compared to the other or a C has the same problem, etc.—the frequency of the RC circuit in one quadrature signal path is too low and the frequency of the CR circuit in the other quadrature signal path is too high. FIG. 1 is a graphic representation of the DaSilva implementation, which shows that at the specified frequency—100 MHz—the quadrature signals are equal in amplitude, but the phase differential between the two quadrature signals varies across the frequency spectrum—in this example at the LO frequency of 100 MHz the phase difference is 100° instead of 90°. In order to achieve the proper phase relationship, a static Vcal signal is used in conjunction with the detected amplitudes, the Vcal signal being selected from a table for the frequency of the particular local oscillator signal input. However, the Vcal signal cannot account for dynamic changes to the network due to time and temperature, so the network needs either frequent calibration or always has some phase error present.

An alternative method, if amplitude matching is not important, uses a phase detector and feedback loop to adjust one quadrature (RC) path or the other quadrature (CR) path until perfect phase quadrature is achieved, as illustrated by U.S. Pat. No. 4,908,532 (Chadwick). Ignoring amplitude matching, however, may cause amplitude errors, even though the signal is passed through limiting stages. Because the phase difference may be 90° over a wide range of amplitude differences, one side or the other might be so starved of signal that the limiting amplifiers cannot limit. This causes poor match between the two mixers, since the local oscillator level is not the same at the inputs to the mixers.

What is desired is an automatic quadrature network for a quadrature frequency converter that provides equal amplitude and ideal quadrature phase for quadrature signals derived from a local oscillator.

BRIEF SUMMARY OF THE INVENTION

Accordingly, the present invention provides an automatic quadrature network with phase and amplitude detection that provides equal amplitude and ideal quadrature phase for quadrature signals derived from a local oscillator. An RC circuit provides one quadrature path, and a CR circuit provides another quadrature path. The outputs from the RC/CR circuits are amplitude detected to produce an amplitude control signal. The outputs also are amplitude limited, and the phase between the outputs at the limiter outputs is detected to produce a phase control signal. The amplitude and phase control signals are combined to generate respective control signals for the RC/CR circuits to automatically align the RC/CR circuits so that the quadrature signals are of equal amplitude and ideal quadrature phase.

The objects, advantages and other novel features of the present invention are apparent from the following detailed description when read in conjunction with the attached drawing figures and claims.

DETAILED DESCRIPTION OF THE INVENTION

Figure 1:
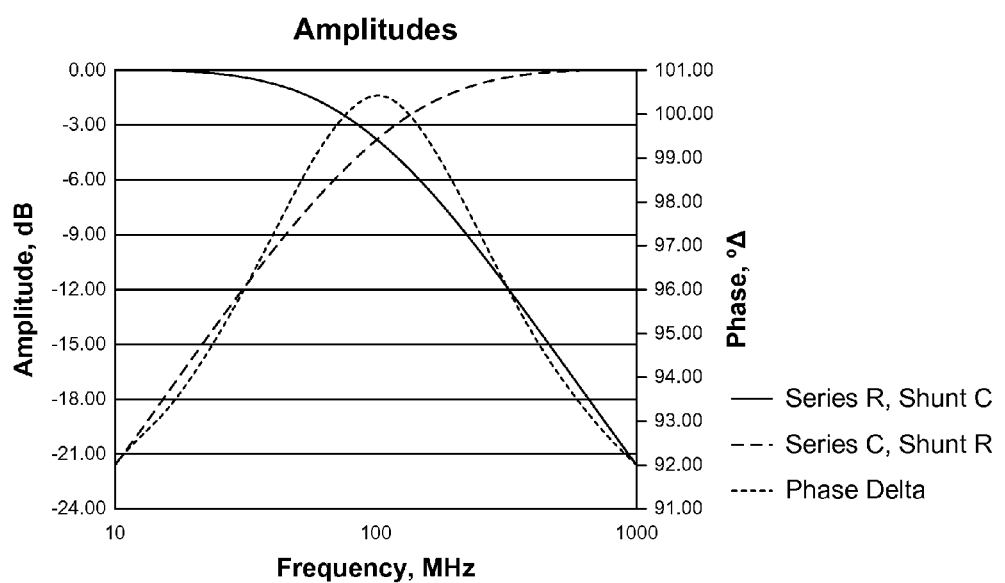
FIG. 1 is a graphic illustration of one prior art method of assuring equal amplitude quadrature signals for an input local oscillator signal, but not ideal phase quadrature.
Figure 2:
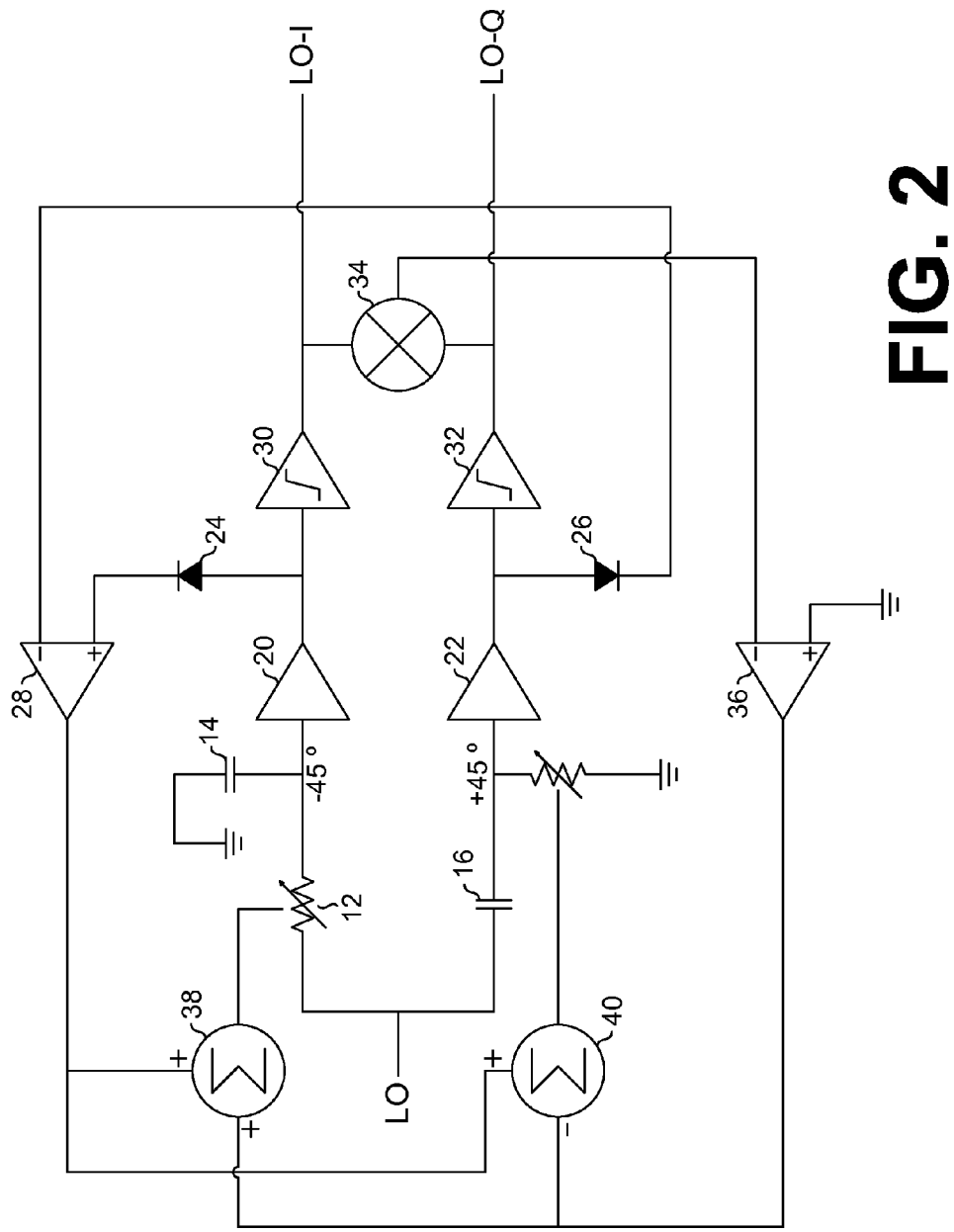
FIG. 2 is a block diagram view of an automatic quadrature network according to the present invention.

Referring now to FIG. 2, a local oscillator signal is input to a pair of paths, one path (RC) having a first variable resistor 12 in series with a first capacitor 14 to ground, and the other path (CR) having a second capacitor 16 in series with a second variable resistor 18 to ground. The resistor/capacitor junctions of the respective paths are coupled to inputs of respective buffering linear amplifier stages 20, 22. The outputs from the amplifier stages 20, 22 are input to respective diode peak detectors 24, 26 to detect the respective amplitudes of the signals output from the amplifier stages. The amplitude signals from the diode peak detectors 24, 26 are input to a first differential d.c. amplifier 28, the difference at the output being a d.c. amplitude control signal—zero, if the amplitudes are equal, or either plus or minus the difference, depending upon which amplitude signal is greater.

After the respective amplifier stages 20, 22, the paths drive respective limiting amplifier stages 30, 32, the outputs of which are the desired quadrature components (LO-I and LO-Q) for the LO input signal, which outputs also are input to a phase detector 34. The output from the phase detector 34 is input to a second differential d.c. amplifier 36, the second input of which is tied to ground, to provide a d.c. phase control signal—zero, if the phases are in ideal phase quadrature, or non-zero, if the phases are not in ideal phase quadrature.

The d.c. control signals from the respective differential d.c. amplifiers 28, 36 are input to respective summation networks 38, 40, one acting as an adder and the other acting as a subtractor. The output from the adder 38 controls the first variable resistor 12 at the input of the first path, while the output from the subtractor 40 controls the second variable resistor tied to ground in the second path. When LO-I and LO-Q are of equal amplitude and ideal phase quadrature, the respective d.c. error signals at the inputs of the differential d.c. amplifiers 28, 36 are reduced to zero, and the d.c. control signals hold their values.

In a "real world" environment, the RC and CR circuits for the respective quadrature paths are not ideal, and the limiting amplifiers 30, 32 introduce their own phase errors as a function of input amplitude. Neither of the prior references, DaSilva or Chadwick, entirely answers these problems. With only a Chadwick phase detector 34 there is nothing to center on, and the RC/CR circuits wander from one end of the adjustment range to the other, trying to hold constant phase. Eventually the RC/CR circuits are driven to one end of their range, where they are unlikely to be able to recover. DaSilva gives the RC/CR circuits something to lock onto, since the amplitudes only balance at a single frequency. However even then, there may be large phase errors that destroy ideal phase quadrature, which errors cannot be corrected automatically.

Figure 3:
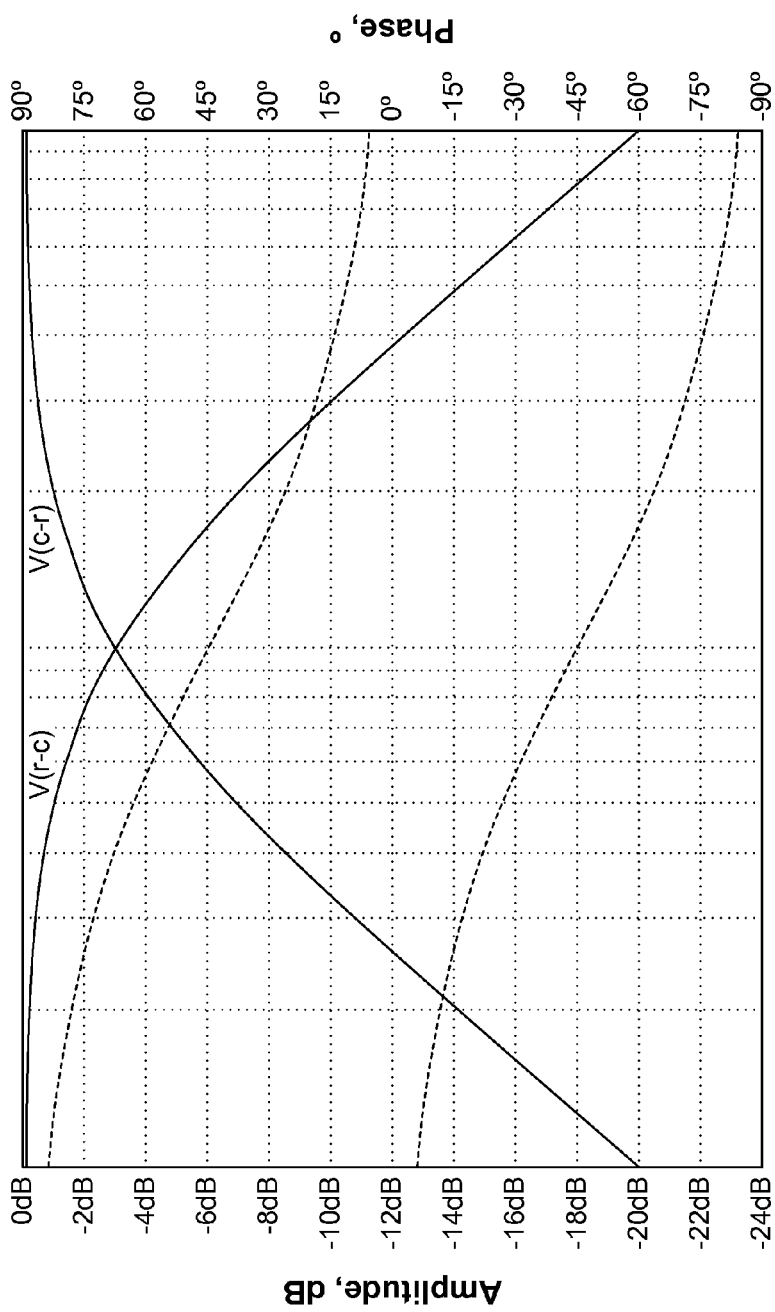
FIG. 3 is a graphic illustration of the quadrature outputs from the automatic quadrature network according to the present invention.

FIG. 3 show graphically the result of the network of FIG. 2 using both amplitude and phase detection to automatically correct for any phase/amplitude errors as they arise in the two quadrature signal paths. The result is equal amplitude at the LO frequency—100 MHz in this example—and a constant 90° phase relationship across the entire frequency range due to the RC and CR circuits automatically being correctly aligned.

Thus, the present invention provides an automatic quadrature network with both amplitude and phase detection by feeding back detected amplitude differences from the RC/CR circuits as well as detected variations from ideal phase quadrature between the quadrature output signals, which differences and variations together provide an automatic control signal to align the RC/CR circuits to produce equal amplitude and ideal phase quadrature for the quadrature output signals.

What is claimed is:

1. An automatic quadrature network that produces a pair of output quadrature signals having equal amplitude and ideal phase quadrature for a desired frequency signal comprising:
    a pair of quadrature signal paths having the desired frequency signal as an input to produce a pair of interim quadrature signals at respective outputs;
    means for detecting respective amplitudes of the interim quadrature signals to produce an amplitude control signal;
    means for detecting a phase difference between the interim quadrature signals to produce a phase control signal;
    means for combining the amplitude and phase control signals to produce respective quadrature control signals; and
    means for aligning the pair of quadrature signal paths using the respective quadrature control signals to produce the pair of output quadrature signals having equal amplitudes and ideal phase quadrature.

2. The automatic quadrature network as recited in claim 1 wherein the pair of quadrature signal paths comprise:
    an RC circuit having the desired frequency signal as an input and having an output;
    a CR circuit having the desired frequency signal as an input and having an output; and
    respective linear amplifiers having inputs coupled to the respective outputs of the RC and CR circuits to provide the interim quadrature signals at respective outputs of the linear amplifiers.

3. The automatic quadrature network as recited in claim 2 wherein the amplitude detecting means comprises:
    a first diode detector having the one of the interim quadrature signals as an input to produce a first amplitude signal;
    a second diode detector having the other of the interim quadrature signals as an input to produce a second amplitude signal; and
    means for combining the first and second amplitude signals to produce the amplitude control signal at an output, the amplitude control signal being a difference between the first and second amplitude signals.

4. The automatic quadrature network as recited in claim 3 wherein the phase difference detecting means comprises:
    respective limiting amplifiers having inputs coupled to receive respective ones of the interim quadrature signals to produce the output quadrature signals at respective outputs;
    a phase detector having inputs coupled to the outputs of the limiting amplifiers and having an output to produce a phase difference signal; and
    a comparator having the phase difference signal as a first input and having a ground signal as a second input to produce the phase control signal at an output.

5. The automatic quadrature network as recited in claim 4 wherein the combining means comprises:
    means for summing the amplitude and phase control signals to produce a first control signal for the RC circuit; and
    means for differencing the amplitude and phase control signals to produce a second control signal for the CR circuit.

6. The automatic quadrature network as recited in claim 5 wherein the aligning means comprises:
    means for varying the resistance of the RC circuit using the first control signal; and
    means for varying the resistance of the CR circuit using the second control signal.

7. An improved quadrature network of the type having an RC quadrature path and a CR quadrature path to produce quadrature output signals for a frequency signal input to the respective paths and having means for detecting the amplitudes of the quadrature output signals from the respective paths to generate an amplitude control signal to adjust the respective paths to assure equal amplitudes for the quadrature output signals of the frequency signal at a particular frequency, the improvement comprising:
    means for amplitude limiting the quadrature output signals to produce limited quadrature output signals as the quadrature output signals;
    means for detecting a phase difference between the limited quadrature output signals to produce a phase control signal; and
    means for combining the amplitude and phase control signals to produce a combined control signal to automatically adjust the respective paths to assure equal amplitudes for the limited quadrature output signals and ideal phase quadrature between the limited quadrature output signals at any frequency for the frequency signal.

8. The improved quadrature network as recited in claim 7 wherein the detecting means comprises a phase detector having the limited quadrature output signals as inputs and the phase control signal as an output.

9. The improved quadrature network as recited in claim 8 wherein the combining means comprises:
    a first combiner having the amplitude and phase control signals from the amplitude detecting means and the phase detector as inputs and a first combined control signal as an output, the first combined control signal being the sum of the amplitude and phase control signals for adjusting the RC quadrature path; and a second combiner having the amplitude and phase control signals from the amplitude detecting means and the phase detector as inputs and a second combined control signal as an output, the second combined control signal being the difference between the amplitude and phase control signals for adjusting the CR quadrature path, the first and second combined control signals being the combined control signal to assure equal amplitudes and ideal phase quadrature of the limited quadrature output signals.

10. The improved quadrature network as recited in claim 9 wherein the limiting means comprises:
   a first limiter amplifier coupled to receive an output from the RC path as an input to provide a first limited quadrature output signal at an output coupled to one of the inputs of the phase detector; and
   a second limiter amplifier coupled to receive an output from the CR path as an input to provide a second limited quadrature output signal at an output coupled to another one of the inputs of the phase detector; the first and second limited quadrature output signals being the limited quadrature output signals.

11. A method of automatically generating a pair of quadrature signals for a frequency signal, the pair of quadrature signals being of equal amplitude and ideal phase quadrature, comprising the steps of:
   inputting the frequency signal to a pair of quadrature signal paths to produce a pair of interim quadrature signals at respective outputs of the quadrature signal paths;
   detecting respective amplitudes of the interim quadrature signals to produce an amplitude control signal;
   detecting a phase difference between the interim quadrature signals to produce a phase control signal;
   combining the amplitude and phase control signals to produce respective quadrature control signals; and
   aligning the pair of quadrature signal paths using the respective quadrature control signals to generate the pair of output quadrature signals having equal amplitudes and ideal phase quadrature.

12. The method as recited in claim 11 further comprising the step of limiting the amplitudes of the interim quadrature signals to produce limited quadrature signals as the interim quadrature signals for input to the phase difference detecting step.

* * * * *